United States Patent
Yeh et al.

(10) Patent No.: US 6,835,622 B2
(45) Date of Patent: Dec. 28, 2004

(54) GATE ELECTRODE DOPING METHOD FOR FORMING SEMICONDUCTOR INTEGRATED CIRCUIT MICROELECTRONIC FABRICATION WITH VARYING EFFECTIVE GATE DIELECTRIC LAYER THICKNESSES

(75) Inventors: Ling-Yen Yeh, Taipei (TW); Jyh-Chyurn Guo, Chutung Hsinchu (TW); Ih-Chin Chen, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/161,837

(22) Filed: Jun. 4, 2002

(65) Prior Publication Data

US 2003/0232473 A1 Dec. 18, 2003

(51) Int. Cl.[7] .......................................... H01L 21/8234
(52) U.S. Cl. ....................... 438/275; 438/276; 438/197; 438/585
(58) Field of Search .................................. 438/197, 218, 438/219, 275, 276, 279, 294, 353, 585, 592

(56) References Cited

U.S. PATENT DOCUMENTS

| | | | | |
|---|---|---|---|---|
| 5,047,358 A | * | 9/1991 | Kosiak et al. | 438/200 |
| 5,468,666 A | * | 11/1995 | Chapman | 438/226 |
| 5,497,021 A | * | 3/1996 | Tada | 257/369 |
| 5,672,521 A | | 9/1997 | Barsan et al. | |
| 6,054,354 A | * | 4/2000 | Nowak et al. | 438/275 |
| 6,133,093 A | * | 10/2000 | Prinz et al. | 438/257 |
| 6,147,008 A | | 11/2000 | Chwa et al. | |
| 6,191,049 B1 | | 2/2001 | Song | |
| 6,207,510 B1 | * | 3/2001 | Abeln et al. | 438/276 |
| 6,235,591 B1 | | 5/2001 | Balasubramanian et al. | |
| 6,265,267 B1 | | 7/2001 | Huang | |

* cited by examiner

*Primary Examiner*—Maria F. Guerrero
(74) *Attorney, Agent, or Firm*—Tung & Associates

(57) ABSTRACT

Within a semiconductor fabrication and a method for fabricating the semiconductor fabrication there is provided a series of field effect devices having in a first instance an optional pair of different gate dielectric layer thicknesses, and in a second instance different dopant distribution profiles with respect to a pair of gate electrodes formed upon a pair of gate dielectric layers of a single thickness. The method provides the semiconductor fabrication with multiple gate dielectric layer thicknesses, actual and effective, with enhanced manufacturability and reliability.

8 Claims, 2 Drawing Sheets

GATE ELECTRODE DOPING METHOD FOR FORMING SEMICONDUCTOR INTEGRATED CIRCUIT MICROELECTRONIC FABRICATION WITH VARYING EFFECTIVE GATE DIELECTRIC LAYER THICKNESSES

BACKGROUND OF THE INVENTION

1. Field of the Invention

The present invention relates generally to methods for forming gate dielectric layers within semiconductor integrated circuit microelectronic fabrications. More particularly, the present invention relates to methods for forming multiple gate dielectric layers with multiple thicknesses within semiconductor integrated circuit microelectronic fabrications.

2. Description of the Related Art

Semiconductor integrated circuit microelectronic fabrications are formed from semiconductor substrates over which are formed patterned conductor layers which are separated by dielectric layers.

As semiconductor integrated circuit microelectronic fabrication integration levels have increased and semiconductor integrated circuit microelectronic fabrication functionality levels have increased, it has become increasingly common in the art of semiconductor integrated circuit microelectronic fabrication to form within semiconductor integrated circuit microelectronic fabrications pluralities of semiconductor devices which are formed with corresponding pluralities of gate dielectric layers having corresponding pluralities of gate dielectric layer thicknesses. Within the context of the present invention, gate dielectric layers are intended as dielectric layers which are formed directly upon semiconductor substrates, whether or not they are employed within field effect transistor (FET) devices, although gate dielectric layers are most typically employed within field effect transistor (FET) devices within semiconductor integrated circuit microelectronic fabrications. Similarly, although gate dielectric layers within semiconductor integrated circuit microelectronic fabrications are most commonly formed employing thermal oxidation methods, gate dielectric layers within semiconductor integrated circuit microelectronic fabrications may also be formed employing various combinations of thermal oxidation methods, deposition methods and nitridation methods.

It has become increasingly common in the art of semiconductor integrated circuit microelectronic fabrication to form within semiconductor integrated circuit microelectronic fabrications pluralities of semiconductor devices which are formed with corresponding pluralities of gate dielectric layers having corresponding pluralities of gate dielectric layer thicknesses insofar as the functional requirements and operational requirements of the pluralities of semiconductor devices formed within the semiconductor integrated circuit microelectronic fabrications often demand the plurality of gate dielectric layers having the plurality of gate dielectric layer thicknesses. For example and without limitation, within embedded semiconductor integrated circuit microelectronic fabrications (i.e., semiconductor integrated circuit microelectronic fabrications which perform both a logic function and a memory function), it is common to employ comparatively thin gate dielectric layers within field effect transistor (FET) devices which perform the logic function, such as to enhance operating speed of the field effect transistor (FET) devices which perform the logic function, while employing comparatively thick gate dielectric layers within field effect transistor (FET) devices which perform memory functions or other peripheral functions, wherein the field effect transistor (FET) devices which perform the memory function or other peripheral function may be subject to comparatively higher operating voltages.

While it is thus desirable in the art of semiconductor integrated circuit microelectronic fabrication to provide pluralities of semiconductor devices having corresponding pluralities of gate dielectric layers in turn having corresponding pluralities of gate dielectric layers thicknesses, and often unavoidable in the art of semiconductor integrated circuit microelectronic fabrication to provide pluralities of semiconductor devices having corresponding pluralities of gate dielectric layers in turn having corresponding pluralities of gate dielectric layer thicknesses, forming within semiconductor integrated circuit microelectronic fabrications such semiconductor devices having corresponding pluralities of gate dielectric layers in turn having corresponding pluralities of gate dielectric layer thicknesses is not entirely without problems in the art of semiconductor integrated circuit microelectronic fabrication.

In that regard, it is often difficult to form within semiconductor integrated circuit microelectronic fabrications pluralities of semiconductor devices having corresponding pluralities of gate dielectric layers in turn having corresponding pluralities of gate dielectric layer thicknesses with enhanced manufacturability and reliability of the semiconductor integrated circuit microelectronic fabrications.

It is thus desirable in the art of semiconductor integrated circuit microelectronic fabrication to form within semiconductor integrated circuit microelectronic fabrications pluralities of semiconductor devices having corresponding pluralities of gate dielectric layers in turn having corresponding pluralities of gate dielectric layers thicknesses, with enhanced manufacturability and reliability of the semiconductor integrated circuit microelectronic fabrications.

It is towards the foregoing object that the present invention is directed.

Various methods have been disclosed in the art of semiconductor integrated circuit microelectronic fabrication for forming, with corresponding pluralities of gate dielectric layers having corresponding pluralities of gate dielectric layer thicknesses, pluralities of semiconductor devices within semiconductor integrated circuit microelectronic fabrications.

Included among the methods, but not limiting among the methods, are methods disclosed within: (1) Barsan et al., in U.S. Pat. No. 5,672,521 (a method which employs implanting into a first region of a silicon semiconductor substrate a dose of a dopant which enhances thermal oxidation of the silicon semiconductor substrate and implanting into a second region of the silicon semiconductor substrate a dose of a nitrogen dopant which inhibits thermal oxidation of the silicon semiconductor substrate, such that upon thermal oxidation of the silicon semiconductor substrate including the first region, the second region and an unimplanted third region there is formed upon the silicon semiconductor substrate a gate dielectric layer having three thickness regions); (2) Chwa et al., in U.S. Pat. No. 6,147,008 (a method which employs implanting through a gate dielectric layer formed upon a silicon semiconductor substrate a dose of a nitrogen implanting ion which inhibits thermal oxidation of the silicon semiconductor substrate and then patterning the gate dielectric layer to form a patterned gate dielectric layer which leaves exposed implanted and unimplanted portions of the silicon semiconductor substrate, prior to thermally oxidizing the silicon semiconductor substrate to reform a gate dielectric layer having three thickness regions); (3) Song, in U.S. Pat. No. 6,191,049 (an additional ion implanting method which employs nitrogen implanting ions and fluorine implanting ions to assist in providing a semiconductor substrate which upon thermal oxidation may have formed thereupon a gate dielectric layer with three thickness regions); (4) Balasubramanian et al., in U.S. Pat. No. 6,235,591 (a sequential thermal annealing method for forming differential gate oxide layer thicknesses within semiconductor integrated circuit microelectronic fabrications with enhanced reliability by employing a bilayer sacrificial mask layer formed of other than a photoresist material); and (5) Huang, in U.S. Pat. No. 6,265,267 (an integrated method for fabricating a flash memory semiconductor integrated circuit microelectronic fabrication having multiple gate dielectric layer thicknesses while employing a polysilicon layer as an oxidizable and sacrificial layer with respect to an intergate dielectric layer within a split gate field effect transistor (FET) device within the flash memory semiconductor integrated circuit microelectronic fabrication).

Desirable in the art of semiconductor integrated circuit microelectronic fabrication are additional methods for forming within semiconductor integrated circuit microelectronic fabrications pluralities of semiconductor devices having corresponding pluralities of gate dielectric layers in turn having corresponding pluralities of gate dielectric layer thicknesses, with enhanced manufacturability and reliability of the semiconductor integrated circuit microelectronic fabrications.

It is towards the foregoing object that the present invention is directed.

SUMMARY OF THE INVENTION

A first object of the present invention is to provide a method for forming within a semiconductor integrated circuit microelectronic fabrication a plurality of semiconductor devices having a corresponding plurality of gate dielectric layers having a corresponding plurality of gate dielectric layer thicknesses.

A second object of the present invention is to provide a method in accord with the first object of the present invention, wherein the semiconductor integrated circuit microelectronic fabrication is formed with enhanced manufacturability.

A third object of the present invention is to provide a method in accord with the first object of the present invention and the second object of the present invention, wherein the method is readily commercially implemented.

In accord with the objects of the present invention, there is provided by the present invention a semiconductor integrated circuit microelectronic fabrication and a method for fabricating the semiconductor integrated circuit microelectronic fabrication.

In accord with the present invention, and within the context of a somewhat narrower embodiment of the present invention, the semiconductor integrated circuit microelectronic fabrication comprises: (1) a semiconductor substrate; (2) at least a first gate dielectric layer, a second gate dielectric layer and a third gate dielectric layer formed laterally adjacent upon the semiconductor substrate; and (3) at least a first polysilicon containing gate electrode formed upon the first gate dielectric layer, a second polysilicon containing gate electrode formed upon the second gate dielectric layer and a third polysilicon containing gate electrode formed upon the third gate dielectric layer. Further in accord with the present invention: (1) the first gate dielectric layer is formed to a first thickness, and the second gate dielectric layer and the third gate dielectric layer are both formed to a second thickness different than the first thickness; and (2) the second polysilicon containing gate electrode has a first dopant distribution profile different in comparison with a second dopant distribution profile of the third polysilicon containing gate electrode such as to provide an apparent difference in thickness of the second gate dielectric layer with respect to the second polysilicon containing gate electrode and the third gate dielectric layer with respect to the third polysilicon containing gate electrode when the first polysilicon containing gate electrode, the second polysilicon containing gate electrode and the third polysilicon containing gate electrode are employed within a series of field effect devices within the semiconductor integrated circuit microelectronic fabrication.

Within the context of a broader embodiment of the present invention, the present invention encompasses a semiconductor integrated circuit microelectronic fabrication predicated upon dopant distribution profile differences within multiple polysilicon containing gate electrodes to effect differences in apparent thicknesses of single actual thickness gate dielectric layers upon which they are formed when the multiple polysilicon containing gate electrodes are employed within multiple field effect devices within the semiconductor integrated circuit microelectronic fabrication. Within the broader embodiment of the present invention, physical thickness differences of gate dielectric layers need not necessarily be present.

The semiconductor integrated circuit microelectronic fabrications in accord with the present invention contemplate corresponding methods for fabricating the semiconductor integrated circuit microelectronic fabrications in accord with the present invention.

There is provided by the present invention a method for forming within a semiconductor integrated circuit microelectronic fabrication a plurality of semiconductor devices having a corresponding plurality of gate dielectric layers having a corresponding plurality of gate dielectric layer thicknesses, wherein the semiconductor integrated circuit microelectronic fabrication is formed with enhanced manufacturability and reliability.

The present invention realizes the foregoing object by fabricating a semiconductor integrated circuit microelectronic fabrication such as to provide at least a pair of different dopant distribution profiles within a pair of polysilicon containing gate electrodes formed upon a pair of gate dielectric layers of a single thickness such as to provide different effective thicknesses of the pair of gate dielectric layers when the pair of gate electrodes is employed within a pair of field effect devices within the semiconductor integrated circuit microelectronic fabrication. The present invention may further employ additional gate electrodes formed upon additional gate dielectric layers of different thicknesses within the semiconductor integrated circuit microelectronic fabrication.

The method of the present invention is readily commercially implemented.

The present invention employs methods and materials as are otherwise generally conventional in the art of semiconductor integrated circuit microelectronic fabrication, but employed within the context of specific materials limitations and specific process limitations to provide the present invention. Since it is thus at least in part specific materials limitations and specific process limitations which provide at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

There is provided by the present invention a method for forming within a semiconductor integrated circuit microelectronic fabrication a plurality of semiconductor devices having a corresponding plurality of gate dielectric layers having a corresponding plurality of gate dielectric layer thicknesses, wherein the semiconductor integrated circuit microelectronic fabrication is formed with enhanced manufacturability and reliability.

The present invention realizes the foregoing object by fabricating a semiconductor integrated circuit microelectronic fabrication such as to provide at least a pair of different dopant distribution profiles within a pair of polysilicon containing gate electrodes formed upon a pair of gate dielectric layers of a single thickness such as to provide different effective thicknesses of the pair of gate dielectric layers when the pair of gate electrodes is employed within a pair of field effect devices within the semiconductor integrated circuit microelectronic fabrication. The present invention may further employ additional gate electrodes formed upon additional gate dielectric layers of different thicknesses within the semiconductor integrated circuit microelectronic fabrication.

Although the preferred embodiment of the present invention illustrates the present within the context of forming within a semiconductor integrated circuit microelectronic fabrication three field effect transistor (FET) devices formed upon three active regions of a semiconductor substrate, the present invention is extendable to increased numbers of field effect devices in general (i.e., field effect capacitor devices and field effect transistor (FET) devices), formed upon increased numbers of active regions of a semiconductor substrate.

Referring now to FIG. 1 to FIG. 7, there is shown a series of schematic cross-sectional diagrams illustrating the results of progressive stages in forming within a semiconductor integrated microelectronic fabrication, and in accord with a preferred embodiment of the present invention, a series of field effect transistor (FET) devices.

Figure 1:
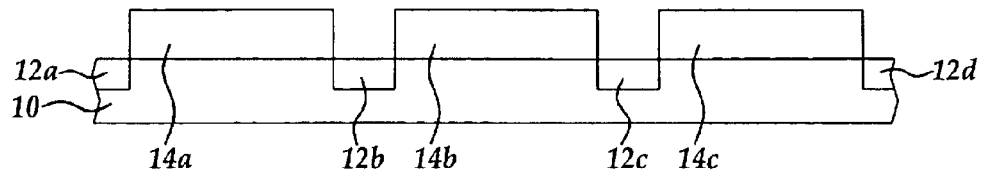
FIG. 1, FIG. 2, FIG. 3, FIG. 4, FIG. 5, FIG. 6 and FIG. 7 show a series of schematic cross-sectional diagrams illustrating the results of progressive stages in forming, in accord with a preferred embodiment of the present invention, a semiconductor integrated circuit microelectronic fabrication in accord with the present invention.

Shown in FIG. 1 is a schematic cross-sectional diagram of the semiconductor integrated circuit microelectronic fabrication at an early stage in its fabrication in accord with the preferred embodiment of the present invention.

Shown in FIG. 1, in a first instance, is a semiconductor substrate 10 having formed therein a series of isolation regions 12a, 12b, 12c and 12d which define a series of active regions of the semiconductor substrate 10. Similarly, there is also shown within the schematic cross-sectional diagram of FIG. 1 a series of first gate dielectric layers 14a, 14b and 14c formed upon the corresponding series of active regions of the semiconductor substrate 10 as defined by the series of isolation regions 12a, 12b, 12c and 12d.

Within the preferred embodiment of the present invention with respect to the semiconductor substrate 10, the semiconductor substrate 10 may be formed of semiconductor materials as are conventional in the art of semiconductor integrated circuit microelectronic fabrication, including but not limited to silicon semiconductor materials, germanium semiconductor materials, silicon-germanium semiconductor materials and compound semiconductor materials. Typically and preferably, the semiconductor substrate 10 is a silicon or silicon-germanium alloy semiconductor substrate having at least either N- or P-doped regions.

Within the preferred embodiment of the present invention with respect to the series of isolation regions 12a, 12b, 12c and 12d, the series of isolation regions 12a, 12b, 12c and 12d may be formed employing any of several methods, including but not limited to isolation region thermal growth methods and isolation region deposition/patterning methods. For the preferred embodiment of the present invention, the series of isolation regions 12a, 12b, 12c and 12d is, as is illustrated within the schematic cross-sectional diagram of FIG. 1, formed as a series of shallow trench isolation (STI) regions.

Finally, within the preferred embodiment of the present invention with respect to the series of first gate dielectric layers 14a, 14b and 14c, the layers 14a, 14b and 14c are typically and preferably formed employing a thermal oxidation method at least in part of silicon oxide of a thickness from about 10 to about 100 angstroms each.

Figure 2:
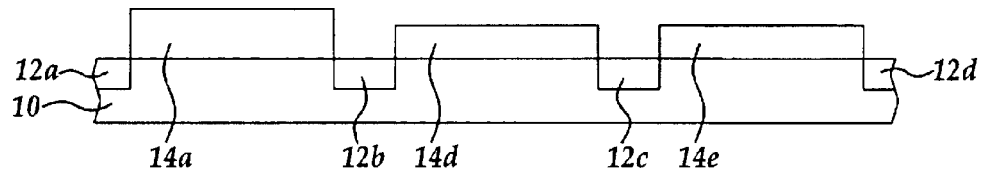

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein, in a first instance, there is stripped from the semiconductor integrated circuit microelectronic fabrication the pair of first gate dielectric layers 14b and 14c, while leaving remaining the first gate dielectric layer 14a.

Within the preferred embodiment of the present invention, the pair of first gate dielectric layers 14b and 14c may be stripped from the semiconductor integrated circuit microelectronic fabrication whose schematic cross-sectional diagram is illustrated in FIG. 2 while leaving remaining the first gate dielectric layer 14a, while in turn employing photolithographic masking methods and etch methods as are conventional in the art of semiconductor integrated circuit microelectronic fabrication.

Similarly, there is also shown within the schematic cross-sectional diagram of FIG. 2, after having stripped from the semiconductor integrated circuit microelectronic fabrication whose schematic cross-sectional diagram is illustrated in FIG. 1 the pair of first gate dielectric layers 14b and 14c, a pair of second gate dielectric layers 14d and 14e formed in place of the pair of first gate dielectric layers 14b and 14c.

Within the preferred embodiment of the present invention, the pair of second gate dielectric layers 14d and 14e is typically and preferably formed employing a thermal oxidation method analogous or equivalent to the thermal oxidation method employed for forming the series of first gate dielectric layers 14a, 14b and 14c, but formed to a thickness of from about 1 to about 120 angstroms each.

While the schematic cross-sectional diagram of FIG. 2 thus illustrates a semiconductor integrated circuit microelectronic fabrication having formed therein a single first gate dielectric layer 14a formed of a comparative greater thickness and a pair of second gate dielectric layers 14b and 14c each formed of a single comparative lesser thickness, the present invention may also provide value under circumstances where there exists a pair of first gate dielectric layers of greater thickness than a single second gate dielectric layer of lesser thickness. Thus, the present invention is intended in general to include circumstances where there is a merely a difference in thickness of a single gate dielectric layer of a first thickness in comparison with a pair of gate dielectric layers of a second thickness.

Figure 3:
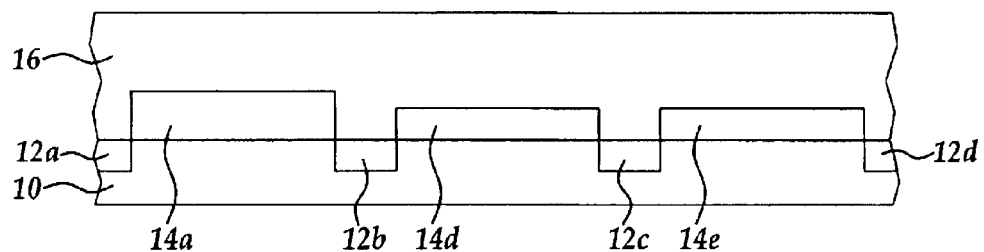

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein there is formed covering the semiconductor integrated circuit microelectronic fabrication, including the first gate dielectric layer 14a and the pair of second gate dielectric layers 14d and 14e, a blanket polysilicon containing layer 16.

Within the preferred embodiment of the present invention, the blanket polysilicon containing layer 16 may be formed employing methods as are conventional in the art of semiconductor integrated circuit microelectronic fabrication, including in particular chemical vapor deposition (CVD) methods. Typically and preferably, the blanket polysilicon containing layer is formed of a doped polysilicon or polycide (doped polysilicon/metal silicide stack) material, with a dopant polarity as appropriate to the semiconductor integrated circuit microelectronic fabrication, although in accord with further description below, the blanket polysilicon layer 16 may alternatively also be formed of an undoped polysilicon material.

Figure 4:
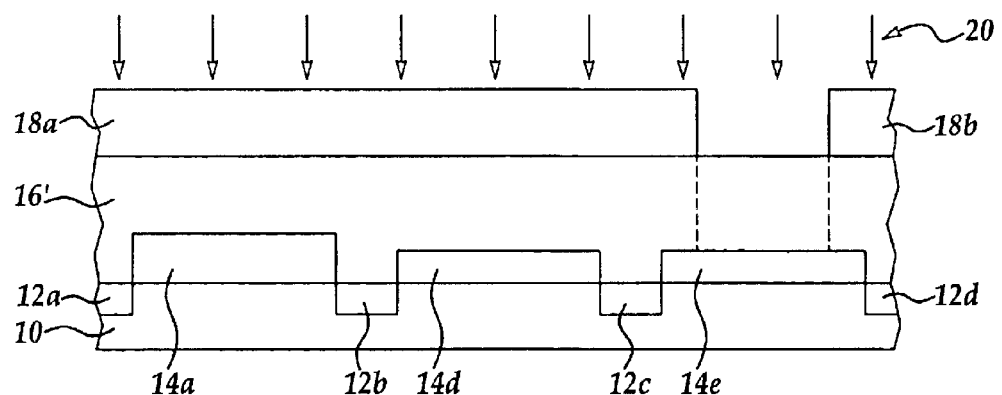

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein, in a first instance, there is formed upon the blanket polysilicon containing layer 16 a pair of patterned photoresist layers 18a and 18b which leaves exposed a portion of the blanket polysilicon containing layer 16 over the second gate dielectric layer 14e.

Within the preferred embodiment of the present invention, the pair of patterned photoresist layers 18a and 18b may be formed employing methods and materials as are otherwise generally conventional in the art of semiconductor integrated circuit microelectronic fabrication.

Shown also within the schematic cross-sectional diagram of FIG. 4 is the results of implanting the blanket polysilicon containing layer 16, while employing the pair of patterned photoresist layers 18a and 18b as an ion implant mask layer, a dose of first dopant implanting ions 20, to form from the blanket polysilicon containing layer 16 a once ion implanted blanket polysilicon containing layer 16'.

Within the preferred embodiment of the present invention, the blanket polysilicon containing layer 16 is implanted to form the once ion implanted blanket polysilicon containing layer 16' in a fashion such that when forming from the blanket polysilicon containing layer 16 a series of gate electrodes upon the first gate dielectric layer 14a and the pair of second gate dielectric layers 14d and 14e, the pair of gate electrodes formed upon the pair of second gate dielectric layers 14d and 14e is formed with a sufficiently different dopant distribution profile such as to provide a different effective gate dielectric layer thickness for each of a pair of field effect transistor (FET) devices formed with respect to the pair of second gate dielectric layers 14d and 14e.

The foregoing result may be realized by adjusting a dopant polarity, dopant dose and ion implantation energy of the first dopant implanting ions 20 with respect to a dopant polarity and concentration within the blanket polysilicon containing layer 16 such as to provide a third dopant depletion region within the blanket polysilicon containing layer 16 adjoining the second gate dielectric layer 14c.

Figure 5:
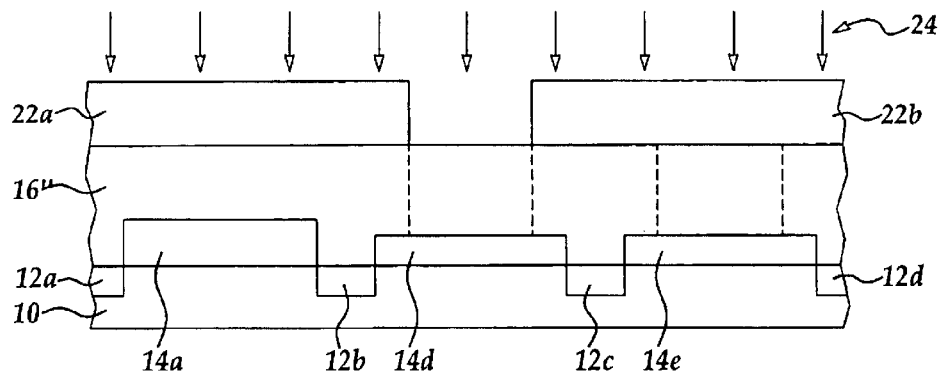

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein, optionally, there is formed upon the once ion implanted blanket polysilicon containing layer 16' after having stripped therefrom the pair of patterned first photoresist layers 18a and 18b a pair of patterned second photoresist layers 22a and 22b which leaves exposed a portion of the once ion implanted blanket polysilicon containing layer 16' over the second gate dielectric layer 14d. Similarly, and as is also illustrated within the schematic cross-sectional diagram of FIG. 5, the pair of patterned second photoresist layers 22a and 22b is then employed as a pair of ion implant mask layers with respect to a dose of second dopant implanting ions 24 to form from the once ion implanted blanket polysilicon containing layer 16' a twice ion implanted blanket polysilicon containing layer 16".

Within the preferred embodiment of the present invention, the pair of patterned second photoresist layers 22a and 22b may be formed employing methods and materials analogous or equivalent to the methods and materials employed for forming the pair of patterned first photoresist layers 18a and 18b as illustrated within the schematic cross-sectional diagram of FIG. 3. Similarly, the dose of second dopant implanting ions 24 is typically and preferably (but not necessarily) of polarity equivalent to the dose of first dopant implanting ions 20, but of varying concentration and energy such as to provide a second dopant depletion region within the twice ion implanted blanket polysilicon containing layer 16' with respect to the second gate dielectric layer 14d of thickness different that the thickness of the third dopant depletion region with respect to the second gate dielectric layer 14e.

Figure 6:
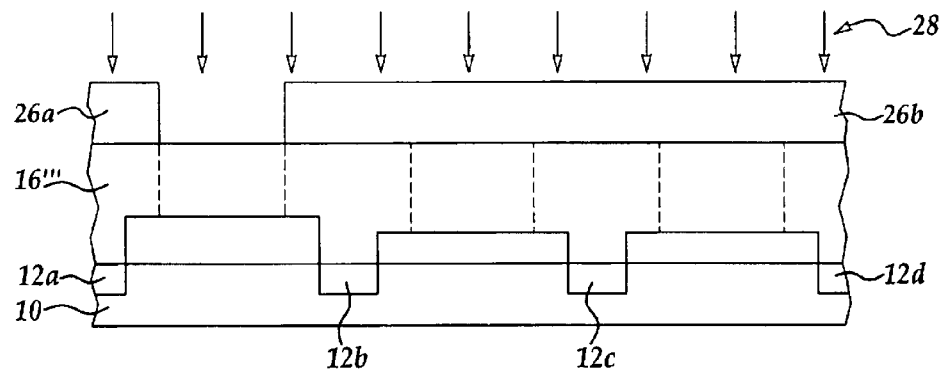

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein, in a first instance, there is formed upon the twice ion implanted blanket polysilicon containing layer 16" a pair of patterned third photoresist layers 26a and 26b after having first stripped therefrom the pair of patterned second photoresist layers 22a and 22b, to thus leave exposed a portion of the twice ion implanted blanket second polysilicon containing layer 16" over the first gate dielectric layer 14a. Similarly, there is also illustrated within the schematic cross-sectional diagram of FIG. 6 the results of implanting, while employing the pair of patterned third photoresist layers 26a and 26b as an ion implant mask, in conjunction with a dose of third dopant implanting ions 28, the twice ion implanted blanket polysilicon containing layer 16" to form a three times ion implanted blanket polysilicon containing layer 16'''.

As is understood by a person skilled in the art, the optional processing of the semiconductor integrated circuit microelectronic fabrication as illustrated within the schematic cross-sectional diagram of FIG. 5 and the schematic cross-sectional diagram of FIG. 6 may be desirable under circumstances where the blanket polysilicon containing layer 16 as illustrated within the schematic cross-sectional diagram of FIG. 3 is formed of a doped polysilicon or polycide material, such as to provide clearly distinguishable dopant depletion regions and optimal tuning of electrical properties of a series of gate electrodes formed from the three times ion implanted blanket polysilicon containing layer 16'''. In the alternative, the sequential ion implanting of the blanket polysilicon containing layer 16 within the context of FIG. 4, FIG. 5 and FIG. 6 to provide the three times ion implanted blanket polysilicon containing layer 16''' will be required under circumstances where the blanket polysilicon containing layer 16 is formed in a first instance of an undoped polysilicon material.

Figure 7:
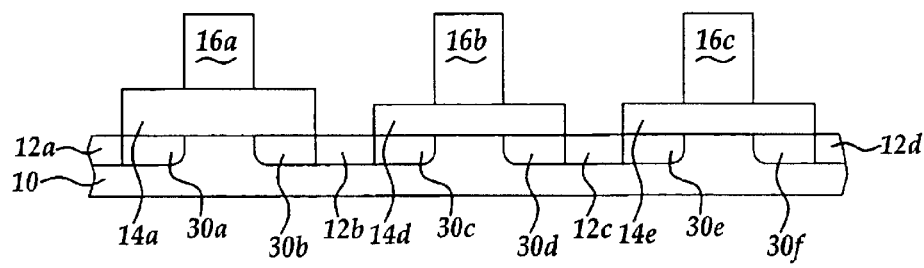

Referring now to FIG. 7, there is shown a schematic cross-sectional diagram illustrating the results of further processing of the semiconductor integrated circuit microelectronic fabrication whose schematic cross-sectional diagram is illustrated in FIG. 6.

Shown in FIG. 7 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 6, but wherein: (1) the pair of patterned third photoresist layers 26a and 26b has been stripped from the semiconductor integrated circuit microelectronic fabrication; and (2) the three times ion implanted blanket polysilicon containing layer 16''' has been patterned to form a series of gate electrodes 16a, 16b and 16c upon the series of the first gate dielectric layer 14a and the pair of second gate dielectric layers 14d and 14e.

Finally, there is also shown within the schematic cross-sectional diagram of FIG. 7 a series of source/drain regions 30a, 30b, 30c, 30d, 30e and 30f, formed into active regions of the semiconductor substrate at areas not covered by the series of gate electrodes 16a, 16b and 16c.

Within the preferred embodiment of the present invention, the pair of patterned third photoresist layers 26a and 26b may be stripped from the semiconductor integrated circuit microelectronic fabrication whose schematic cross-sectional diagram is illustrated in FIG. 6, to provide in part the semiconductor integrated circuit microelectronic fabrication whose schematic cross-sectional diagram in illustrated in FIG. 7 while employing photoresist stripping methods and materials as are conventional in the art of semiconductor integrated circuit microelectronic fabrication. Similarly, within the preferred embodiment of the present invention, the series of gate electrodes 16a, 16b and 16c is formed from the three times ion implanted blanket polysilicon containing layer 16''' while employing a photolithography and patterning methods as are similarly also conventional in the art of semiconductor integrated circuit microelectronic fabrication. Finally, the series of source/drain regions 30a, 30b, 30c, 30d, 30e and 30f is formed employing an ion implantation method as is similarly also conventional in the art of semiconductor integrated circuit microelectronic fabrication.

Upon forming the semiconductor integrated circuit microelectronic fabrication whose schematic cross-sectional diagram is illustrated in FIG. 7, there is formed a semiconductor integrated circuit microelectronic fabrication in accord with the preferred embodiment of the present invention. The semiconductor integrated circuit microelectronic fabrication has formed therein a series of field effect transistor (FET) devices, a pair of which is formed upon a pair of gate dielectric layers formed of a single thickness, but operating with different effective thicknesses, due to differing dopant distribution profiles and dopant depletion regions within a pair of gate electrodes which comprises the pair of field effect transistor (FET) devices.

As is understood by a person skilled in the art, the preferred embodiment of the present invention is illustrative of the present invention rather than limiting of the present invention. Revisions and modifications may be undertaken with respect to a semiconductor integrated circuit microelectronic fabrication in accord with the preferred embodiment of the present invention, while still fabricating a semiconductor integrated circuit microelectronic fabrication in accord with the present invention, further in accord with the accompanying claims.

What is claimed is:

1. A method for fabricating a semiconductor fabrication comprising:

providing a semiconductor substrate;

forming laterally adjacent upon the semiconductor substrate a minimum of a first gate dielectric layer and a second gate dielectric layer each formed of a single thickness; and forming a minimum of a first doped polysilicon containing gate electrode upon the first gate dielectric layer and a second doped polysilicon containing gate electrode upon the second gate dielectric layer, wherein the first gate electrode has a first dopant distribution profile different in comparison with a second dopant distribution profile of the second gate electrode, to provide an apparent difference in thickness of the first gate dielectric layer with respect to the first gate electrode and the second gate dielectric layer with respect to the second gate electrode when each of the first gate electrode and the second gate electrode is employed within a field effect device within the semiconductor fabrication, further wherein the first dopant distribution profile and the second dopant distribution profile are effected incident to selective ion implantation of a blanket undoped polysilicon containing gate electrode material layer prior to patterning thereof to form the first doped polysilicon containing gate electrode and the second doped polysilicon containing gate electrode.

2. The method of claim 1 wherein each of the first doped polysilicon containing gate electrode and second doped polysilicon containing gate electrode is formed of doped polysilicon containing material selected from the group consisting of doped polysilicon materials and polycide materials.

3. A method for fabricating a semiconductor fabrication comprising:

providing a semiconductor substrate;

forming laterally adjacent upon the semiconductor substrate at least a first gate dielectric layer, a second gate dielectric layer and a third gate dielectric layer; and forming at least a first doped polysilicon containing gate electrode upon the first gate dielectric layer, a second doped polysilicon containing gate electrode upon the second gate dielectric layer and a third doped polysilicon containing gate electrode upon the third gate dielectric layer, wherein:

the first gate dielectric layer is formed to a first thickness, and the second gate dielectric layer and the third gate dielectric layer are both formed to a second thickness different than the first thickness; and the second doped polysilicon containing gate electrode has a second dopant distribution profile different in comparison with a third dopant distribution profile of the third doped polysilicon containing gate electrode such as to provide an apparent difference in thickness of the second gate dielectric layer with respect to the second gate electrode and the third gate dielectric layer with respect to the third gate electrode when each of the first gate electrode, second gate electrode and third gate electrode is employed within a series of field effect devices within the semiconductor fabrication.

4. The method of claim 3 wherein the first gate dielectric layer is thicker than the second gate dielectric layer and the third gate dielectric layer.

5. The method of claim 3 wherein the first gate dielectric layer is thinner than the second gate dielectric layer and the third gate dielectric layer.

6. The method of claim 3 wherein the first gate dielectric layer is formed to a thickness of from about 10 to about 100 angstroms.

7. The method of claim 3 wherein each of the second gate dielectric layer and the third gate dielectric layer is formed to a thickness of from about 1 to about 120 angstroms.

8. A method for fabricating a semiconductor fabrication comprising providing a semiconductor substrate;

forming laterally adjacent upon the semiconductor substrate at least a first gate dielectric layer, a second gate dielectric layer and a third gate dielectric layer; and forming at least a first doped polysilicon containing gate electrode upon the first gate dielectric layer, a second doped polysilicon containing gate electrode upon the second gate dielectric layer and a third doped polysilicon containing gate electrode upon the third gate dielectric layer, wherein:

the first gate dielectric layer is formed to a first thickness, and the second gate dielectric layer and the third gate dielectric layer are both formed to a second thickness different than the first thickness; and the second doped polysilicon containing gate electrode has a second dopant distribution profile different in comparison with a third dopant distribution profile of the third doped polysilicon containing gate electrode such as to provide an apparent difference in thickness of the second gate dielectric layer with respect to the second gate electrode and the third gate dielectric layer with respect to the third gate electrode when each of the first gate electrode, second gate electrode and third gate electrode is employed within a series of field effect devices within the semiconductor fabrication, further wherein the first dopant distribution profile and the second dopant distribution profile are effected incident to selective ion implantation of a blanket undoped polysilicon containing gate electrode ant the second doped polysilicon containing gate electrode.

* * * * *